United States Patent
Kanehiro

(10) Patent No.: US 11,342,523 B2
(45) Date of Patent: May 24, 2022

(54) LIGHT EMITTING DEVICE WITH OXIDATION PREVENTED QUANTUM DOTS

(71) Applicant: SHARP KABUSHIKI KAISHA, Sakai (JP)

(72) Inventor: Masayuki Kanehiro, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 0 days.

(21) Appl. No.: 16/975,639

(22) PCT Filed: Mar. 7, 2018

(86) PCT No.: PCT/JP2018/008801
§ 371 (c)(1),
(2) Date: Aug. 25, 2020

(87) PCT Pub. No.: WO2019/171503
PCT Pub. Date: Sep. 12, 2019

(65) Prior Publication Data
US 2020/0411785 A1    Dec. 31, 2020

(51) Int. Cl.
*H01L 29/08* (2006.01)
*H01L 51/50* (2006.01)
*H01L 51/56* (2006.01)

(52) U.S. Cl.
CPC ............ *H01L 51/502* (2013.01); *H01L 51/56* (2013.01)

(58) Field of Classification Search
CPC .................................................... H01L 51/502
See application file for complete search history.

(56) References Cited

U.S. PATENT DOCUMENTS

| | | | | |
|---|---|---|---|---|
| 9,035,286 | B2* | 5/2015 | Chen | H01L 27/322 257/40 |
| 9,768,404 | B1* | 9/2017 | Steckel | H01L 51/506 |
| 2009/0174022 | A1* | 7/2009 | Coe-Sullivan | G01J 3/2823 257/448 |
| 2011/0036971 | A1* | 2/2011 | Ho | H01L 51/426 250/214.1 |
| 2011/0079273 | A1* | 4/2011 | Arango | H01L 51/4273 136/252 |
| 2012/0234372 | A1* | 9/2012 | Takayama | H01L 27/301 136/246 |
| 2013/0200360 | A1* | 8/2013 | Oikawa | H01L 51/0085 257/40 |
| 2015/0287878 | A1* | 10/2015 | Ono | H01L 31/0324 438/46 |
| 2016/0272883 | A1* | 9/2016 | Yamane | C09K 15/322 |
| 2016/0276413 | A1* | 9/2016 | Iida | H01L 31/048 |
| 2017/0191638 | A1* | 7/2017 | Kwon | F21V 9/30 |

(Continued)

FOREIGN PATENT DOCUMENTS

| | | |
|---|---|---|
| JP | 2010-009995 A | 1/2010 |
| JP | 2017-025220 A | 2/2017 |

*Primary Examiner* — Caleb E Henry
(74) *Attorney, Agent, or Firm* — ScienBiziP, P.C.

(57) ABSTRACT

To efficiently prevent oxidation of quantum dots in a light-emitting device including the quantum dots, a light-emitting device including a first electrode, a second electrode, and a quantum dot layer between the first electrode and the second electrode, in which quantum dots including a core, a shell covering the core, and a ligand coordinated with a surface of the shell and having an antioxidant property are stacked in the quantum dot layer, is provided.

5 Claims, 7 Drawing Sheets

(56) References Cited

U.S. PATENT DOCUMENTS

| | | | |
|---|---|---|---|
| 2017/0200871 A1* | 7/2017 | Kwon | H01L 33/56 |
| 2018/0019371 A1* | 1/2018 | Steckel | H01L 27/156 |
| 2018/0113361 A1* | 4/2018 | Lee | G02B 6/005 |
| 2019/0081260 A1* | 3/2019 | Xu | H01L 51/5056 |

* cited by examiner

LIGHT EMITTING DEVICE WITH OXIDATION PREVENTED QUANTUM DOTS

TECHNICAL FIELD

The disclosure relates to a light-emitting device with a light-emitting element including quantum dots.

BACKGROUND ART

PTL 1 describes a technology for preventing oxidation of quantum dots and aggregation of quantum dots caused by oxidation of the quantum dots by adding an antioxidant to a solvent in which the quantum dots are dispersed.

CITATION LIST

Patent Literature

PTL 1: JP 2010-9995A (published on Jan. 14, 2010)

SUMMARY

Technical Problem

Many light-emitting elements with quantum dots have been proposed as devices using quantum dots. When quantum dots are oxidized in a light-emitting element, the quantum dots are deactivated and the luminous efficiency of the light-emitting element is reduced. Therefore, in light-emitting elements with quantum dots, oxidation of the quantum dots needs to be avoided more efficiently. The inventor has found a method of preventing oxidation of quantum dots more efficiently than adding an antioxidant to a solvent in which the quantum dots are dispersed, as described in PTL 1.

Solution to Problem

In order to solve the above-described problem, a light-emitting device according to an aspect of the disclosure is a light-emitting device including a light-emitting element including a first electrode, a second electrode, and a quantum dot layer between the first electrode and the second electrode, in which, in the quantum dot layer, quantum dots each including a core, a shell covering the core, and a ligand coordinated with a surface of the shell and having an antioxidant property are stacked.

In addition, in order to solve the above-described problem, a method for manufacturing a light-emitting device according to an aspect of the disclosure is a method for manufacturing a light-emitting device including a light-emitting element including a first electrode, a second electrode, and a quantum dot layer between the first electrode and the second electrode, the method including synthesizing a quantum dot including a core and a shell covering the core, and a ligand having an antioxidant property, coordinating the ligand with a surface of the shell of the quantum dot, and forming the quantum dot layer in which quantum dots are stacked using a solution in which the quantum dots coordinated with the ligand are dispersed in a solvent.

In addition, in order to solve the above-described problem, an apparatus for manufacturing a light-emitting device according to an aspect of the disclosure is an apparatus for manufacturing a light-emitting device including a light-emitting element including a first electrode, a second electrode, and a quantum dot layer between the first electrode and the second electrode, the apparatus including a synthesis device configured to synthesize a quantum dot including a core and a shell covering the core, and a ligand having an antioxidant property, a coordination device configured to coordinate the ligand on a surface of the shell of the quantum dot, and a film formation device configured to form the quantum dot layer in which quantum dots are stacked using a solution in which the quantum dots coordinated with the ligand are dispersed in a solvent.

Advantage Effects of Disclosure

According to an aspect of the disclosure, oxidation of quantum dots is efficiently prevented, which leads to improved reliability and service life of a light-emitting device with quantum dots.

DESCRIPTION OF EMBODIMENTS

First Embodiment

In the present specification, the direction from a quantum dot layer to a first electrode of a light-emitting device is referred to as "downward," and the direction from the quantum dot layer to a second electrode of the light-emitting device is referred to as "upward."

Figure 1:
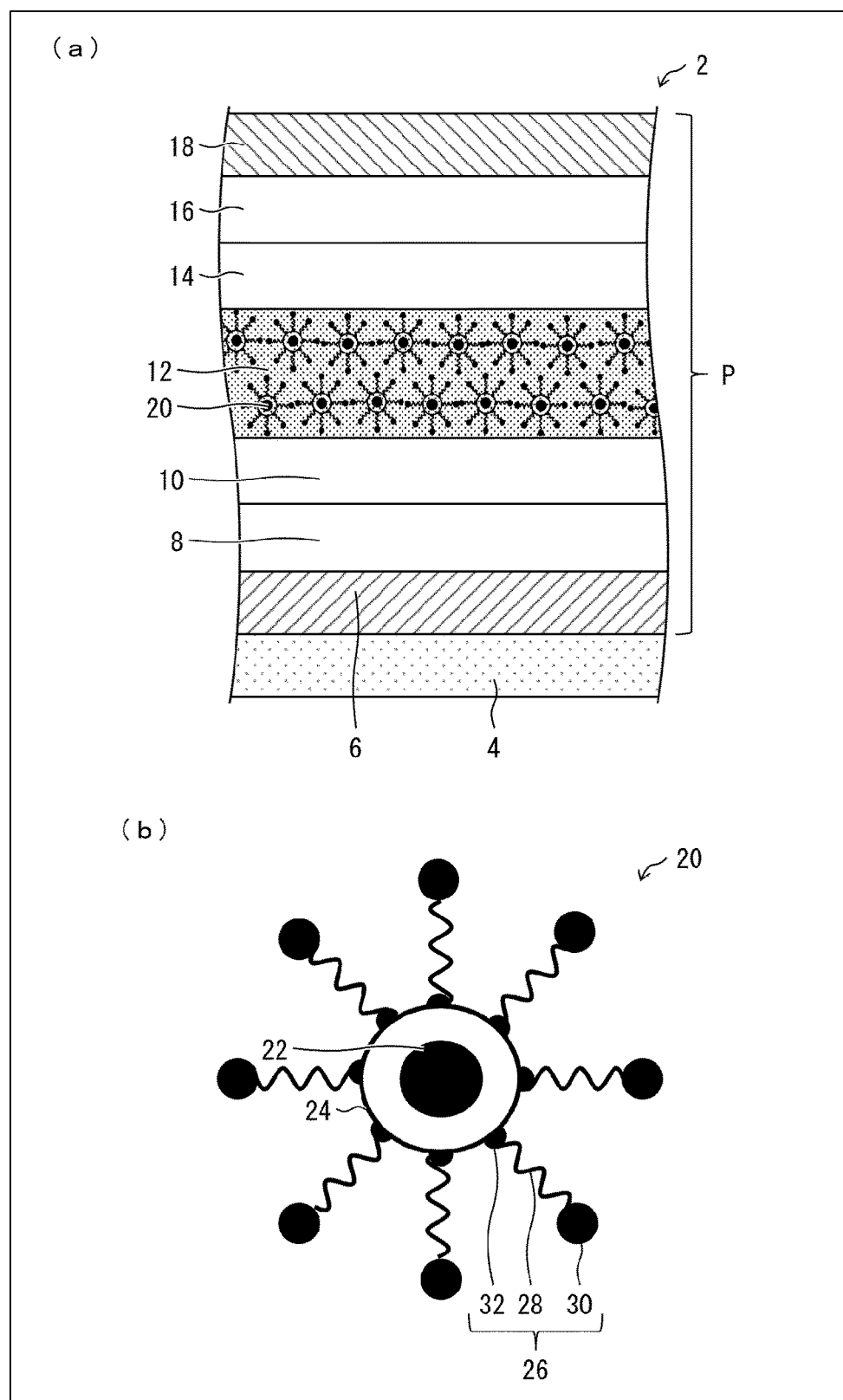
FIG. 1 is a cross-sectional view of a light-emitting device according to a first embodiment of the disclosure, and is a schematic view illustrating a quantum dot of the light-emitting device.

FIG. 1 is an enlarged cross-sectional view of a light-emitting device 2 according to the present embodiment, and is an enlarged view of a quantum dot 20 of the light-emitting device 2.

As illustrated in (a) of FIG. 1, the light-emitting device 2 has a structure in which layers are stacked on an array substrate 4 on which a thin film transistor (TFT), which is not illustrated, has been formed. A first electrode 6, a hole injection layer 8, a hole transport layer 10, a quantum dot layer 12, an electron transport layer 14, an electron injection layer 16, and a second electrode 18 are stacked on the array substrate 4 in order from a bottom layer to form a light-emitting element P.

The array substrate 4 is a substrate in which a TFT that drives the first electrode 6 and the second electrode 18 is formed. A material of the substrate may be glass or may be a foldable plastic. In a case in which a plastic is used for the array substrate 4, a flexible light-emitting device 2 can be obtained. The TFT may be formed on the array substrate 4 using a publicly known method.

In the present embodiment, the first electrode 6 is an anode and the second electrode 18 is a cathode. At least one of the first electrode 6 and the second electrode 18 is a transparent or translucent electrode, and the transparent electrode may contain a transparent oxide such as ITO, IZO, or ISO, for example. The translucent electrode may contain a metal material such as Al, Ag, or MgAg, for example. Further, either the first electrode 6 or the second electrode 18 may contain a metal material, and a preferable metal material is Al, Cu, Au, Ag, or the like having a high visible light reflectivity.

The hole injection layer 8, the hole transport layer 10, the electron transport layer 14, and the electron injection layer 16 may contain materials used for layers of a publicly known light-emitting element of the related art. The hole injection layer may contain, for example, PEDOT:PSS, $MoO_3$, NiO, or the like. The hole transport layer may contain, for example, TPD, poly-TPD, PVK, TFB, CBP, NPD, or the like. The electron transport layer may contain, for example, ZnO nanoparticles, MgZnO nanoparticles, or the like. The electron injection layer may contain $Alq_3$, PBD, TPBi, BCP, Balq, CDBP, Liq, or the like.

The quantum dot layer 12 has a plurality of quantum dots 20 (semiconductor nanoparticles). The quantum dots 20 may be formed by stacking one to several layers in the quantum dot layer 12. The quantum dots 20 are a luminescent material that has a valence band level and a conduction band level and emits light through recombination of holes in the valence band level with electrons in the conduction band level. Because light emitted from the quantum dots 20 has a narrower spectrum due to a quantum confinement effect, it is possible to obtain light emission with relatively deep chromaticity.

In the present embodiment, each of the quantum dots 20 has a core 22, a shell 24 covering the core 22, and ligands 26 coordinated on a surface of the shell 24, as illustrated in (b) of FIG. 1.

The core 22 and shell 24 may contain a material for quantum dots having a publicly known core/shell structure. In the present embodiment, the core 22 preferably contains C, Si, Ge, Sn, P, Se, Te, Cd, Zn, Mg, S, In, or O. The shell 24 contains Cd, Se, S, Zn, Te, In, P, O, Te, or Mg. Note that, although the core 22 is covered by the shell 24, the core 22 is illustrated as passing through the shell 24 in the drawing for the sake of simple illustration.

Each ligand 26 has a long chain part 28, an antioxidant part 30, and a coordination part 32. The ligand 26 has the antioxidant part 30 at one end of the long chain part 28 and the coordination part 32 on the other end. The ligand 26 is coordinated with a quantum dot 20 when the surface of the shell 24 has a coordinate bond with the coordination part 32.

The antioxidant part 30 has an antioxidant property. Specifically, the antioxidant part 30 functions to prevent deactivation of the quantum dot 20 by capturing and deactivating oxygen or radical compounds that can cause the deactivation of the quantum dot 20. The antioxidant part 30, for example, curbs reaction between free radicals and oxygen or captures peroxy radicals generated from the reaction. Alternatively, the antioxidant part 30 degrades hydroperoxide generated from a hydrogen abstraction reaction of peroxy radicals, for example.

The antioxidant part 30 contains, for example, at least one of a hindered amine compound, a phenol-based compound, a phosphoric acid-based compound, and a sulfur-based compound, or a composite compound thereof. In particular, in a case in which the antioxidant part 30 contains a hindered amine compound, the antioxidant part 30 generally has a higher antioxidant function than an antioxidant part 30 containing a phenol-based compound. Furthermore, the antioxidant part 30 containing a hindered amine compound has a strong photo-oxidation preventing effect. Therefore, in a device in which the quantum dots 20 themselves emit light as in the light-emitting device 2 of the present embodiment, the ligand 26 having the antioxidant part 30 containing a hindered amine compound having a strong photo-oxidation preventing effect is preferably provided in the quantum dots 20.

It is also conceivable to employ the light-emitting device 2 as a display device for outdoor use such as a smartphone, a wearable terminal, digital signage, and the like. In such a case, the light-emitting device 2 preferably includes the quantum dots 20 each including the ligand 26 having the antioxidant part 30 containing a hindered amine compound having a strong photo-oxidation preventing effect.

Furthermore, using a hindered amine compound alone in the antioxidant part 30 is preferable in that the coloration in the light-emitting device 2 can be reduced compared to when a composite compound is used. For example, when a composite compound of a hindered amine compound and a phenol-based compound is used in the antioxidant part 30, the light-emitting device 2 may be colored due to the phenol-based compound having a quinone structure. On the other hand, when a hindered amine compound alone is used in the antioxidant part 30, the occurrence of coloration of the light-emitting device 2 can be reduced.

An example of the ligand 26 according to the present embodiment is expressed in a general formula (1) below.

[Chemical Formula 1]

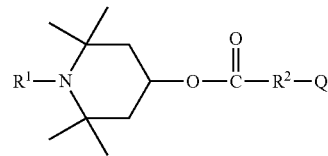

(1)

Note that the antioxidant part 30 consists of an $R^1$ of the general formula (1) and a 2,2,6,6-tetramethylpiperidinol skeleton. Here, $R^1$ includes a hydrogen atom, a hydroxyl group, an alkyl group having 1 to 30 carbon atoms, a hydroxyalkyl group, an alkoxy group, a hydroxyalkoxy group, or an oxy radical. Furthermore, $R^1$ may contain at least one of a hindered amine compound, a phenol-based compound, a phosphoric acid-based compound, and a sulfur-based compound.

Furthermore, $R^2$ is the long chain part 28, and is selected from the group consisting of —$(CH_2)_n$—, —$(CH_2$—$O)_m$—, —$(CH_2)_x$—(CH=CH)—$(CH_2)_y$—, or a combination thereof. Here $0 \le n \le 18$, $0 \le m \le 18$, $4 \le n+m \le 18$, $4 \le x+y \le 18$, and $4 \le m+x+y \le 18$ are satisfied.

Additionally, Q is the coordination part 32, and is a hydroxyl group, a thiol group, a carboxyl group, an amino group, a sulfo group, a mercapto group, a phosphate group ($H_2PO_4$—), $pH_2(=O)$—, or POH(OH)(=O)—.

Figure 2:
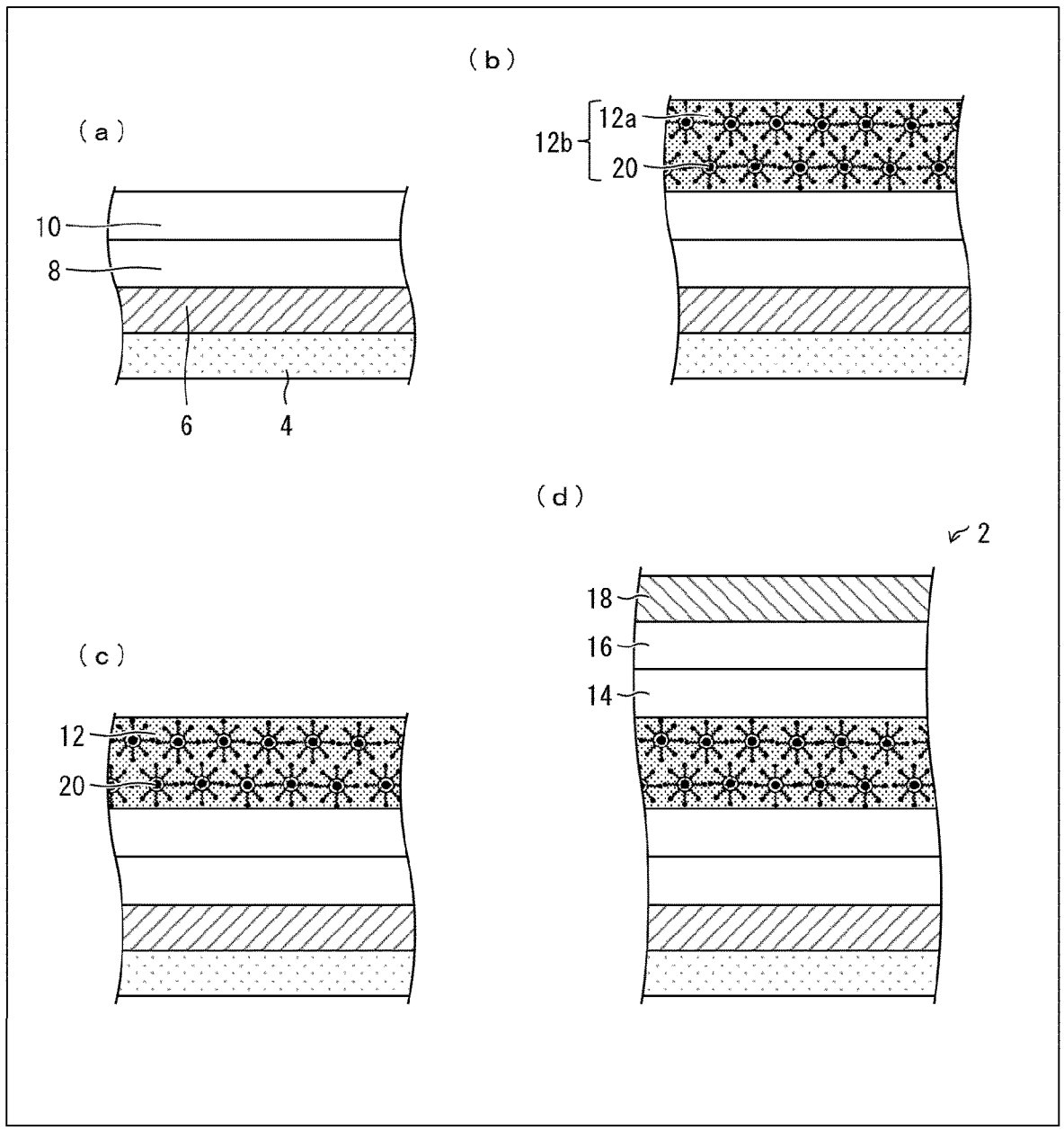
FIG. 2 is a processing cross-sectional view illustrating an example of a method for manufacturing the light-emitting device according to the first embodiment of the disclosure.

The method for manufacturing the light-emitting device 2 according to the present embodiment will be described with reference to FIG. 2. FIG. 2 is a processing cross-sectional view for describing the method for manufacturing the light-emitting device 2.

First, an array substrate 4 including a TFT and various wiring lines connected to the TFT is fabricated, and a first electrode 6 electrically connected to the TFT is formed on the array substrate 4 using a sputtering method or the like. Next, the hole injection layer 8 and the hole transport layer 10 are formed on the upper layer of the first electrode 6 in order from the bottom through coating formation or the like, and the stacked structure illustrated in (a) of FIG. 2 is obtained.

Figure 3:
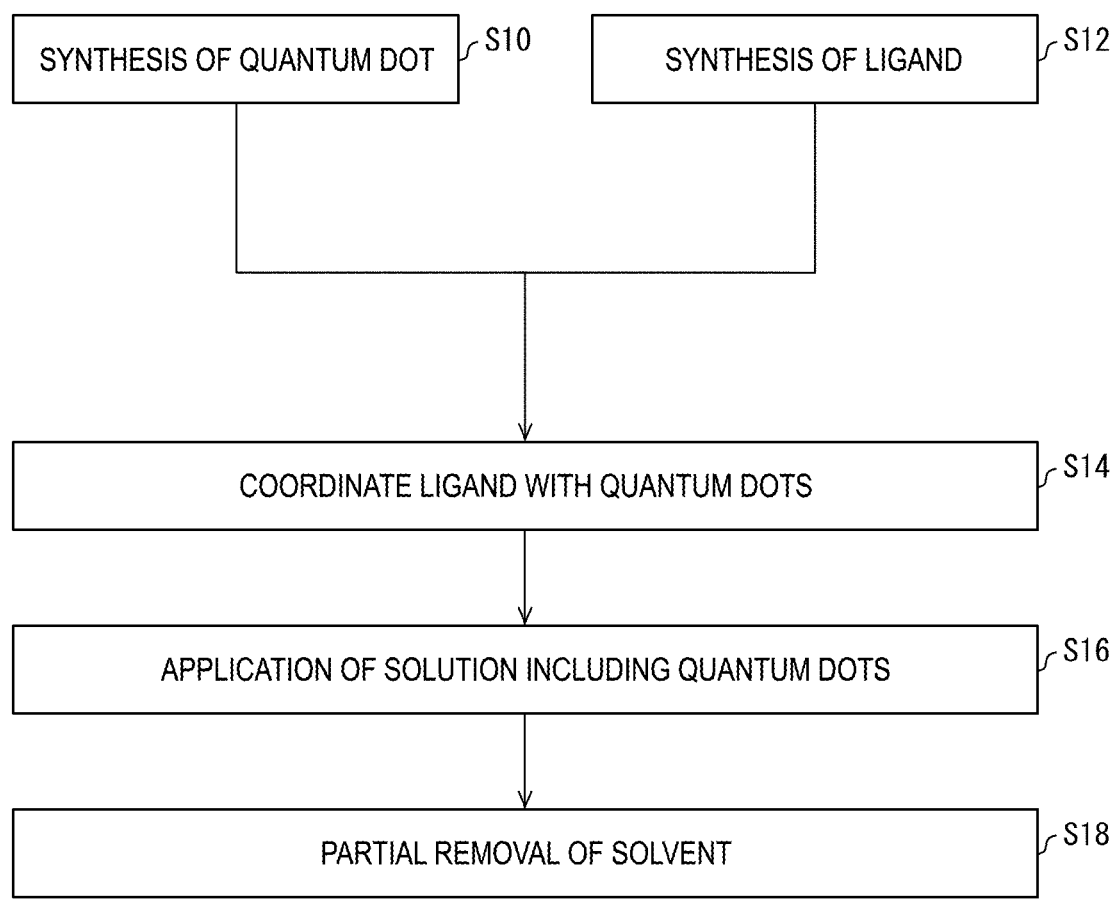
FIG. 3 is a flowchart illustrating an example of a method for forming a quantum dot layer according to the first embodiment of the disclosure.
Figure 4:
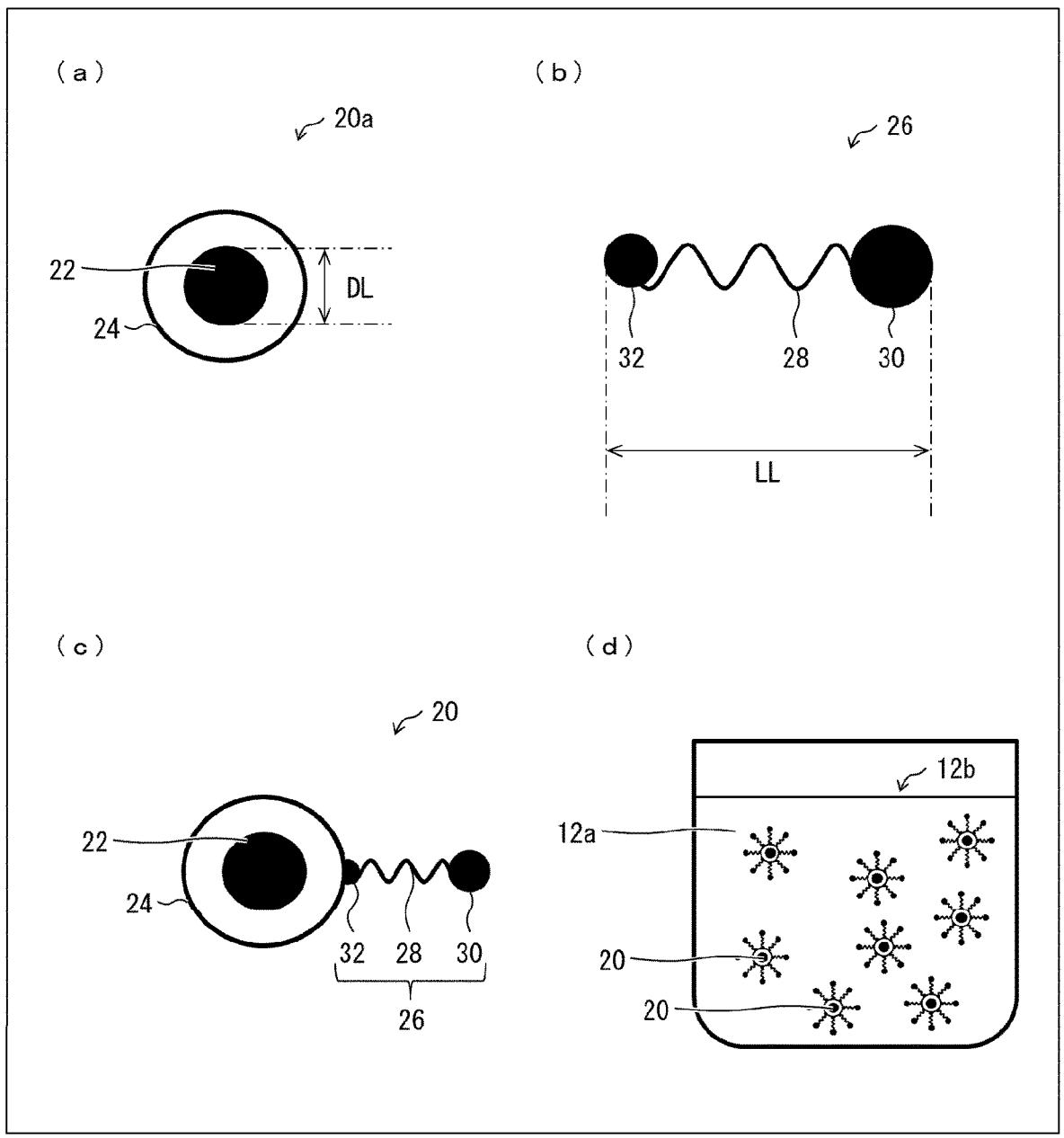
FIG. 4 is a schematic view for describing a method for synthesizing a quantum dot and a ligand, and a method for coordinating a quantum dot and a ligand according to the first embodiment of the disclosure.

Next, the quantum dot layer 12 is formed. In addition to FIG. 2, the formation of the quantum dot layer 12 will be described in detail with reference to FIGS. 3 and 4. FIG. 3 is a flowchart for describing a method for synthesizing quantum dots 20 and a method for forming the quantum dot layer 12 including the quantum dots 20. FIG. 4 is a schematic view for describing the method for synthesizing the quantum dots 20 in more detail.

First, a quantum dot 20a having a core-shell structure with the core 22 and the shell 24 covering the core 22 prior to coordination of the ligand 26 is synthesized as shown in (a) of FIG. 4 (step S10). The quantum dot 20a may be synthesized using a publicly known synthesis method such as a chemical synthesis method. At this time, if a diameter of the core 22 of the obtained quantum dot 20a is defined as DL, the diameter DL is preferably 2 to 10 nm.

Aside from the synthesis of the quantum dots 20a described above, the synthesis of the ligand 26 illustrated in (b) of FIG. 4 is performed (step S12). For example, the ligand 26 represented by the general formula (1) is obtained by esterifying an alcohol having a 2,2,6,6-tetramethylpiperidinol skeleton, and a compound having a fatty acid at least at one end and a desired length. For example, the above-described esterification is possible by direct esterification of a fatty acid with an alcohol, a reaction between a halide of a fatty acid and an alcohol, an ester exchange reaction between a fatty acid and an alcohol, or the like. The obtained ester compound can be purified by appropriately using distillation, recrystallization, a method using a filtration material or an adsorbent material, or the like. At this time, if a length from one end to the other end of the obtained ligand 26, that is, from the end of the antioxidant part 30 to the end of the coordination part 32, is defined as a length LL of the ligand, the length LL is preferably from 0.5 to 5 nm.

Next, the surface of the shell 24 of the synthesized quantum dot 20a is coordinately bonded with the coordination part 32 of the ligand 26 to obtain the quantum dot 20 with which the ligand 26 is coordinated as illustrated in (c) of FIG. 4 (step S14). The above-described coordination may be performed using a method of adding a solution in which the ligand 26 is dispersed to a solution in which the quantum dots 20a are dispersed, or a method of mixing the above-described two solutions, performing centrifugal separation thereon, and removing remaining difference. Although (c) of FIG. 4 illustrates the shell 24 with one ligand 26 in coordination, more ligands 26 may be coordinated with one quantum dot 20.

As a result, a solution 12b in which the quantum dots 20 are dispersed in a solvent 12a illustrated in (d) of FIG. 4 is obtained. The solvent 12a may be a solvent of the above-described mixed solution, and may be, for example, an acyclic aliphatic solvent of hexane, octane, decane, or the like, a cyclic aliphatic solvent of cyclohexane or the like, or an aromatic solvent of toluene, or the like.

Next, as illustrated in (b) of FIG. 2, a solution 12b in which the quantum dots 20 are dispersed is applied to the upper surface of the hole transport layer 10 (step S16). Then, the solvent 12a is partially removed from the solution 12b (step S18). As a result, the quantum dot layer 12 illustrated in (c) of FIG. 2 is obtained, and the process of forming the quantum dot layer 12 is completed.

Finally, the electron transport layer 14, the electron injection layer 16, and the second electrode 18 are formed on the upper layer of the quantum dot layer 12 in order from the bottom by application formation or the like, and the stacked structure illustrated in (d) of FIG. 2 is obtained. As a result, the light-emitting device 2 according to the present embodiment is obtained.

The light-emitting device 2 according to the present embodiment includes the quantum dots 20 with which the ligand 26 having an antioxidant property is coordinated in the quantum dot layer 12. Therefore, in the present embodiment, the density of the compound having the antioxidant property around the periphery of the quantum dots is higher than that of the quantum dot layer formed from the solution in which the quantum dots are dispersed to which the compound having the antioxidant property is added. Therefore, it is possible to more efficiently enhance the function of anti-oxidation of the quantum dots 20. Thus, a reduction in luminous efficiency of the light-emitting device 2 caused by oxidation of the quantum dots 20 can be reduced more efficiently.

Note that a singlet oxygen quenching rate of the antioxidant part 30 of the ligand 26 is $1 \times 10^5$ or greater and $1 \times 10^{10}$ or less. The singlet oxygen quenching rate is an index of the antioxidant effect of the antioxidant part 30. If the singlet oxygen quenching rate of the antioxidant part 30 is within the range described above, it is possible to efficiently prevent oxidation of the quantum dots 20.

Second Embodiment

Figure 5:
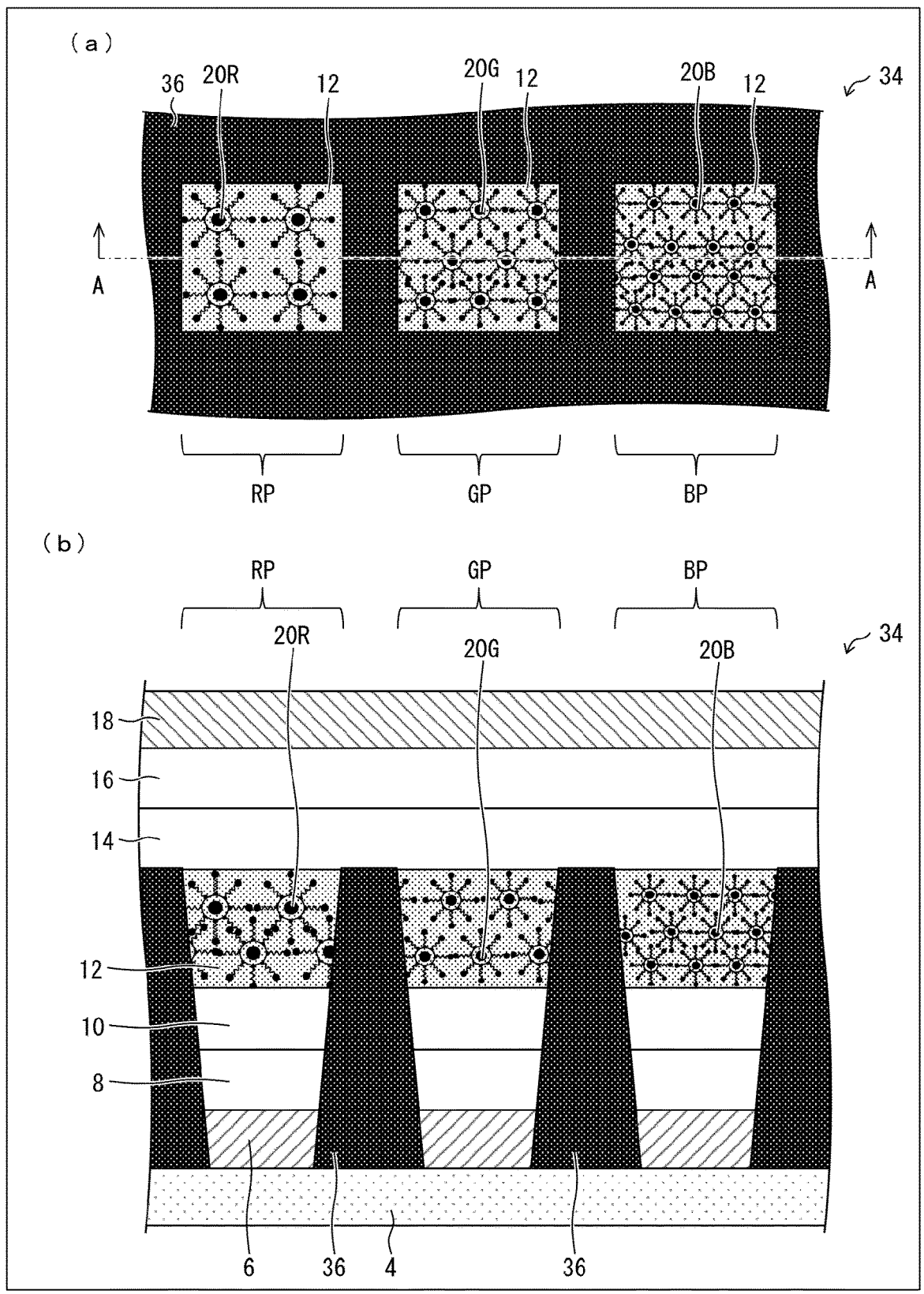
FIG. 5 is a top view and a cross-sectional view of a light-emitting device according to a second embodiment of the disclosure.

FIG. 5 is an enlarged top view and an enlarged cross-sectional view of a light-emitting device 34 according to the present embodiment. (a) of FIG. 5 illustrates a top surface of the light-emitting device 34 according to the present embodiment by passing through the electron transport layer 14, the electron injection layer 16, and the second electrode 18, (b) of FIG. 5 is a cross-sectional arrow view along the line A-A of (a) of FIG. 5.

The light-emitting device 34 according to the present embodiment may further include an edge cover 36 in comparison to the light-emitting device 2 in the previous embodiment, and may have the same configuration except that each layer from the first electrode 6 to the quantum dot layer 12 is divided into a plurality of light-emitting elements. That is, each layer from the first electrode 6 to the quantum dot layer 12 is formed for each of the plurality of divided light-emitting elements. Note that, in the present embodiment, the electron transport layer 14, the electron injection layer 16, and the second electrode 18 are formed to be shared by the plurality of divided light-emitting elements.

In the present embodiment, each layer from the first electrode 6 to the quantum dot layer 12 is divided into a red light-emitting element RP, a green light-emitting element GP, and a blue light-emitting element BP, as illustrated in FIG. 5. The quantum dot layer 12 in the red light-emitting element RP includes, as quantum dots, red quantum dots 20R that emit red light during light emission. Furthermore, the quantum dot layers 12 in the green light-emitting element GP and the blue light-emitting element BP include, as quantum dots, green quantum dots 20G and blue quantum dots 20B that emit green light and blue light during light emission, respectively.

Here, blue light is light having a central wavelength of light emission in a wavelength band from 400 nm to 500 nm. In addition, green light is light having a central wavelength of light emission in a wavelength band greater than 500 nm and smaller than or equal to 600 nm. In addition, red tight is light having a central wavelength of tight emission in a wavelength band greater than 600 nm and smaller than or equal to 780 nm.

Figure 6:
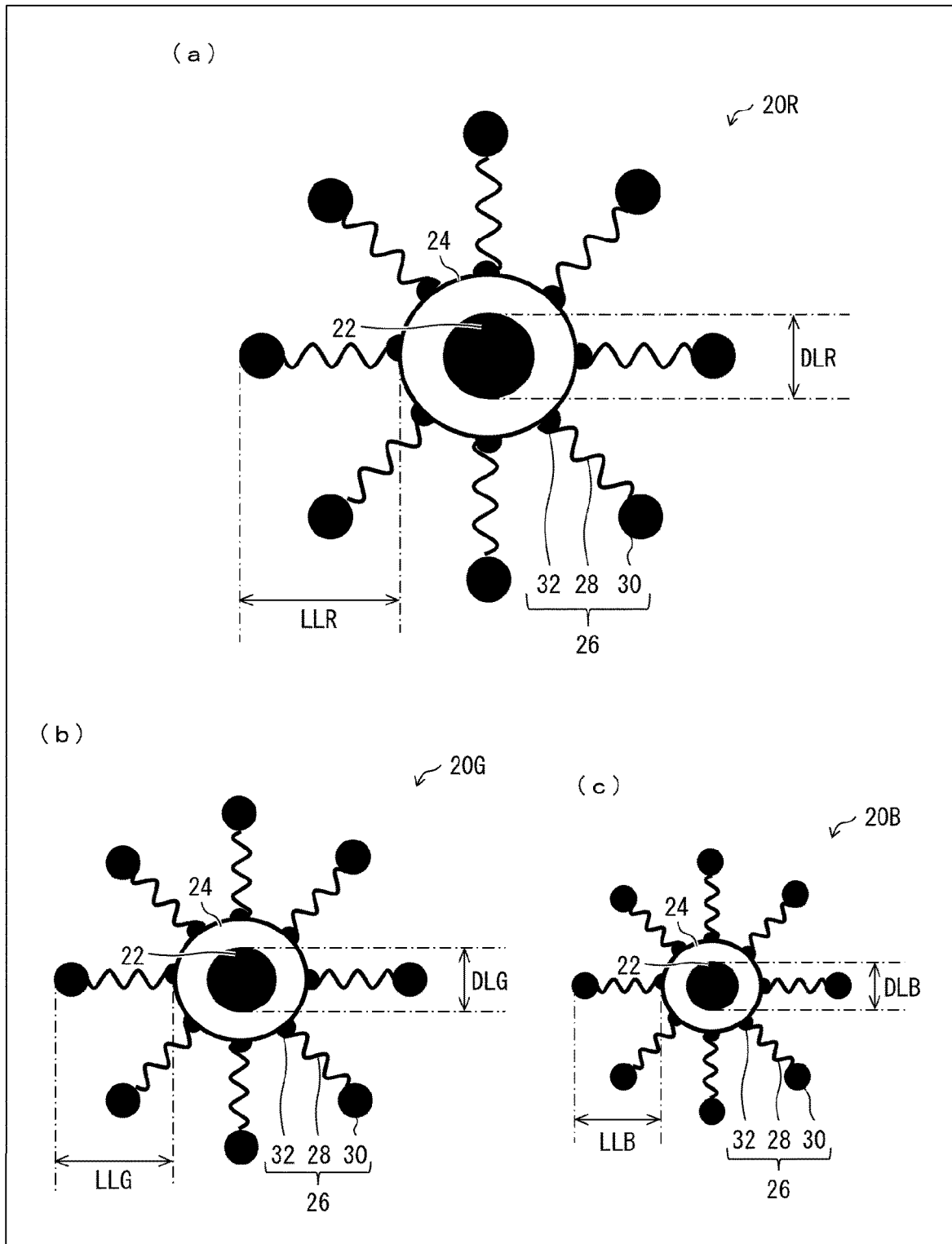
FIG. 6 is a schematic view illustrating a structure of quantum dots according to the second embodiment of the disclosure.

(a), (b), and (c) of FIG. 6 are schematic views illustrating a red quantum dot 20R, a green quantum dot 20G, and a blue quantum dot 20B, respectively, according to the present embodiment. Each of the red quantum dot 20R, the green quantum dot 20G, and the blue quantum dot 20B includes a core 22, a shell 24 covering the core 22, and a ligand 26 coordinated with a surface of the shell 24, similar to the quantum dot 20 in the previous embodiment.

A wavelength of light emitted by the quantum dots is generally proportional to a size of a core diameter of the quantum dots. Therefore, the red quantum dot 20R, the green quantum dot 20G, and the blue quantum dot 20B have different sizes. For example, a diameter of the core 22 of the green quantum dot 20G is smaller than a diameter of the core 22 of the red quantum dot 20R and greater than a diameter of the core 22 of the blue quantum dot 20B. Accordingly, in the present embodiment, a length of the ligand 26 of the green quantum dot 20G is shorter than a length of the ligand 26 of the red quantum dot 20R and longer than a length of the ligand 26 of the blue quantum dot 20B.

As illustrated in FIG. 6, for each of the red quantum dot 20R, the green quantum dot 20G, and the blue quantum dot 20B, diameters of the cores of the quantum dots are defined as a diameter DLR, a diameter DLG, and a diameter DLB. In this case, the diameter DLR>the diameter DLG>the diameter DLB may be satisfied. In addition, as illustrated in FIG. 6, for each of the red quantum dot 20R, the green quantum dot 20G, and the blue quantum dot 20B, lengths of the ligands are defined as a length LLR, a length LLG, and a length LLB, and in this case, the length LLR>the length LLG>the length LLB may be satisfied.

If the diameter of each quantum dot and the length of each ligand in the present embodiment have the dimensions described above, it is possible to design quantum dots that emit light with respective wavelengths more efficiently.

Each of the red quantum dot 20R, the green quantum dot 20G, and the blue quantum dot 20B may be manufactured using the same manufacturing method as the quantum dot 20 in the previous embodiment. Here, a length of the ligand 26 of each quantum dot can be designed by varying a length of the long chain part 28.

In the method for manufacturing the light-emitting device 34 according to the present embodiment, edge covers 36 are first formed on the array substrate 4. Next, for each of regions divided by the edge covers 36, the first electrode 6, the hole injection layer 8, the hole transport layer 10, and the quantum dot layer 12 are formed. At this time, the quantum dot layer 12 is formed from a solution in which the red quantum dots 20R, the green quantum dots 20G, and the blue quantum dots 20B are dispersed in the red light-emitting element RP, the green light-emitting element GP, and the blue light-emitting element BP, respectively.

In the formation of the quantum dot layer 12, for example, the solution 12b in which the red quantum dots 20R are dispersed is applied to the upper layer of the hole transport layer 10 in the red light-emitting element RP, and the solvent 12a in the red light-emitting element RP is partially removed. As a result, the quantum dot layer 12 in the red light-emitting element RP is formed. A similar step is performed for the green light-emitting element GP and the blue light-emitting element BP to form a quantum dot layer 12 in the green light-emitting element GP and the blue light-emitting element BP, respectively.

Note that the hole injection layer 8 and the hole transport layer 10 may contain different materials in each light-emitting element, and may be formed by selecting an appropriate material for each material of the quantum dots 20 in each light-emitting element.

Finally, as in the previous embodiment, the electron transport layer 14, the electron injection layer 16, and the second electrode 18 are formed on the upper layer of the quantum dot layer 12 and the edge covers 36 in order from the bottom through application formation or the like. As a result, the light-emitting device 34 illustrated in FIG. 5 is obtained.

The light-emitting device 34 according to the present embodiment includes the quantum dot layer 12 including quantum dots that emit red, green, and blue light in each of the different light-emitting elements. Therefore, the tight-emitting device 34 according to the present embodiment can display multiple colors. Also, the ligand 26 having an appropriate length can be coordinated with a quantum dot of each color, so that oxidation of the quantum dots can be reduced more efficiently.

Figure 7:
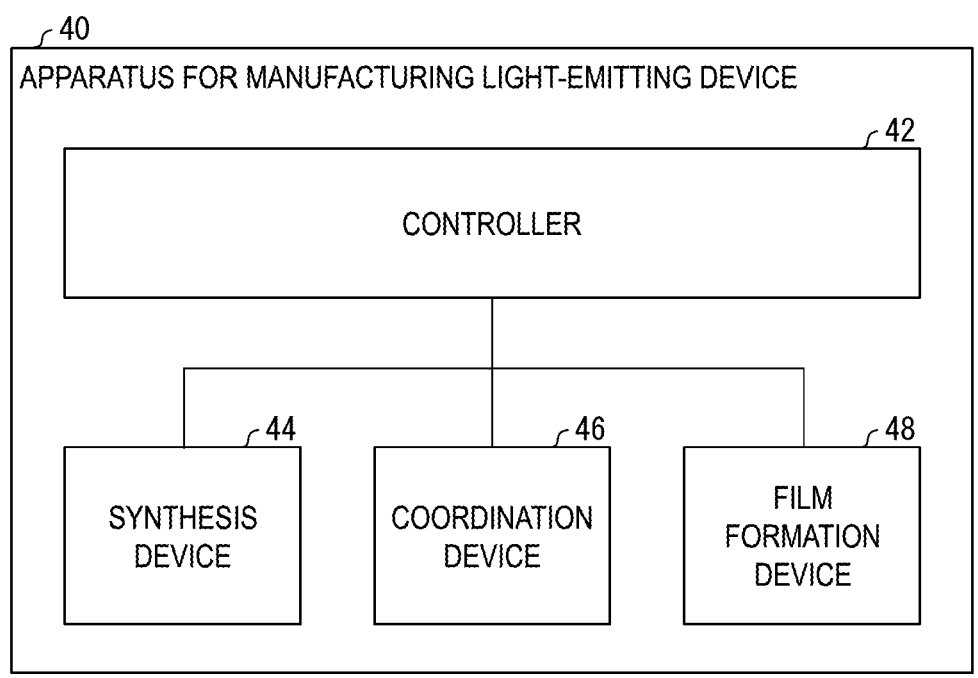
FIG. 7 is a block diagram illustrating an apparatus for manufacturing a light-emitting device according to embodiments of the disclosure.

FIG. 7 is a block diagram illustrating an apparatus for manufacturing a light-emitting device 40 according to the embodiments described above. The apparatus for manufacturing a light-emitting device 40 includes a controller 42, a synthesis device 44, a coordination device 46, and a film formation device 48. The controller 42 controls the synthesis device 44, the coordination device 46, and the film formation device 48. The synthesis device 44 synthesizes core-shell-structured quantum dots 20a and ligands 26 according to the embodiments described above. The coordination device 46 coordinates the core-shell-structured quantum dots 20a with the ligands 26 according to the embodiments described above. The film formation device 48 forms each layer of the light-emitting device according to the embodiments described above, including the quantum dot layer 12.

Supplement

The tight-emitting device of aspect 1 is a light-emitting device including a light-emitting element including a first electrode, a second electrode, and a quantum dot layer between the first electrode and the second electrode, in which, in the quantum dot layer, quantum dots each including a core, a shell covering the core, and a ligand coordinated with a surface of the shell and having an antioxidant property are stacked.

In aspect 2, the ligand contains at least one of a hindered amine compound, a phenol-based compound, a phosphoric acid-based compound, and a sulfur-based compound.

In aspect 3, a singlet oxygen quenching rate of the ligand is $1 \times 10^5$ or greater and $1 \times 10^{10}$ or less.

In aspect 4, a plurality of light-emitting elements are included, the first electrode and the quantum dot layer are provided for each of the plurality of light-emitting elements, and the second electrode is shared by the plurality of light-emitting elements.

In aspect 5, the light-emitting device includes, as the light-emitting elements, a red light-emitting element including red quantum dots emitting red light in the quantum dot layer, a green light-emitting element including green quantum dots emitting green light in the quantum dot layer, and a blue light-emitting element including blue quantum dots emitting blue light in the quantum dot layer.

In aspect 6, a length of the ligand coordinated with the green quantum dots is shorter than a length of the ligand coordinated with the red quantum dots and greater than a length of the ligand coordinated with the blue quantum dots.

The method for manufacturing a light-emitting device of aspect 7 is a method for manufacturing a light-emitting device including a light-emitting element including a first electrode, a second electrode, and a quantum dot layer between the first electrode and the second electrode, the method including synthesizing a quantum dot including a core and a shell covering the core, and a ligand having an antioxidant property, coordinating the ligand on a surface of the shell of the quantum dot, and forming the quantum dot layer in which quantum dots are stacked using a solution in which the quantum dots coordinated with the ligand are dispersed in a solvent.

An apparatus for manufacturing a light-emitting device of aspect 8 is an apparatus for manufacturing a light-emitting device including a light-emitting element including a first electrode, a second electrode, and a quantum dot layer between the first electrode and the second electrode, the apparatus including a synthesis device configured to synthesize a quantum dot including a core and a shell covering the core, and a ligand having an antioxidant property, a coordination device configured to coordinate the ligand on a surface of the shell of the quantum dot, and a film formation device configured to form the quantum dot layer in which quantum dots are stacked using a solution in which the quantum dots coordinated with the ligand are dispersed in a solvent.

The disclosure is not limited to each of the embodiments described above, and various modifications may be made within the scope of the claims. Embodiments obtained by appropriately combining technical approaches disclosed in each of the different embodiments also fall within the technical scope of the disclosure. Moreover, novel technical features can be formed by combining the technical approaches each disclosed in the embodiments.

REFERENCE SIGNS LIST 2, 34 Light-emitting device
6 First electrode
12 Quantum dot layer
12a Solvent
12b Solution
18 Second electrode
20, 20a Quantum dot
20B Blue quantum dot
20G Green quantum dot
20R Red quantum dot
22 Core
24 Shell
26 Ligand
40 Apparatus for manufacturing light-emitting device
P Light-emitting element
RP Red light-emitting element
GP Green light-emitting element
BP Blue light-emitting element

The invention claimed is:
1. A light-emitting device comprising:
a plurality of light-emitting elements, each of the plurality of light-emitting elements includes:
a first electrode;
a quantum dot layer; and
a second electrode shared by the plurality of light-emitting elements, wherein:
the quantum dot layer is disposed between the first electrode and the second electrode,
the quantum dot layer includes quantum dots each including a core, a shell covering the core, and a ligand coordinated with a surface of the shell and having an antioxidant property, wherein the quantum dots are stacked;
the plurality of light-emitting elements comprises:
a red light-emitting element including a red quantum dot emitting red light in the quantum dot layer;
a green light-emitting element including a green quantum dot emitting green light in the quantum dot layer; and
a blue light-emitting element including a blue quantum dot emitting blue light in the quantum dot layer; and
a length of the ligand coordinated with the green quantum dot is shorter than a length of the ligand coordinated with the red quantum dot and greater than a length of the ligand coordinated with the blue quantum dot.
2. The light-emitting device according to claim 1, wherein the ligand contains at least one of a hindered amine compound, a phenol-based compound, a phosphoric acid-based compound, and a sulfur-based compound.
3. The light-emitting device according to claim 1, wherein a singlet oxygen quenching rate of the ligand is $1 \times 10^5$ or greater and $1 \times 10^{10}$ or less.
4. A method for manufacturing a light-emitting device including a plurality of light-emitting elements, each of the plurality of light-emitting elements including a first electrode, a quantum dot layer, and a second electrode shared by the plurality of light-emitting elements, the quantum dot layer is disposed between the first electrode and the second electrode, the method comprising:
synthesizing a quantum dot, the quantum dot includes a core, a shell covering the core, and a ligand having an antioxidant property;
coordinating the ligand on a surface of the shell; and
forming the quantum dot layer in which quantum dots are stacked using a solution, wherein the solution contains quantum dots coordinated with the ligand dispersed in a solvent.
5. An apparatus for manufacturing a light-emitting device including a plurality of light-emitting elements including a first electrode, a quantum dot layer, and a second electrode shared by the plurality of light-emitting elements, the quantum dot layer is disposed between the first electrode and the second electrode, the apparatus comprising:
a synthesis device configured to synthesize a quantum dot, the quantum dot including a core, a shell covering the core, and a ligand having an antioxidant property;
a coordination device configured to coordinate the ligand on a surface of the shell; and
a film formation device configured to form the quantum dot layer in which quantum dots are stacked using a solution, wherein the solution contains quantum dots coordinated with the ligand dispersed in a solvent.

* * * * *